United States Patent
Baxansky et al.

(10) Patent No.: US 8,090,212 B1
(45) Date of Patent: Jan. 3, 2012

(54) METHOD, APPARATUS, AND SYSTEM FOR REDUCING BLURRING OF AN IMAGE USING MULTIPLE FILTERED IMAGES

(75) Inventors: Artemy Baxansky, Nesher (IL); Meir Tzur, Haifa (IL)

(73) Assignee: Zoran Corporation, Sunnyvale, CA (US)

( * ) Notice: Subject to any disclaimer, the term of this patent is extended or adjusted under 35 U.S.C. 154(b) by 854 days.

(21) Appl. No.: 12/130,993

(22) Filed: May 30, 2008

Related U.S. Application Data

(60) Provisional application No. 61/016,199, filed on Dec. 21, 2007.

(51) Int. Cl.
G06K 9/40 (2006.01)

(52) U.S. Cl. ...................................................... 382/260

(58) Field of Classification Search ........... 382/254–275
See application file for complete search history.

(56) References Cited

U.S. PATENT DOCUMENTS

| | | |
|---|---|---|
| 4,975,969 A | 12/1990 | Tal |
| 5,012,522 A | 4/1991 | Lambert |
| 5,164,992 A | 11/1992 | Turk et al. |
| 5,410,609 A | 4/1995 | Kado et al. |
| 5,450,504 A | 9/1995 | Calia |
| 6,088,059 A | 7/2000 | Mihara et al. |
| 6,108,437 A | 8/2000 | Lin |
| 6,285,799 B1 | 9/2001 | Dance et al. |
| 6,429,415 B1 | 8/2002 | Rhoads |
| 6,430,220 B1 | 8/2002 | Determan |
| 6,567,570 B1 | 5/2003 | Steinle et al. |
| 6,586,991 B2 | 7/2003 | Masuda et al. |
| 6,657,566 B1 | 12/2003 | Risbo et al. |
| 6,657,572 B2 | 12/2003 | Lee et al. |
| 6,665,338 B1 | 12/2003 | Midya et al. |
| 7,031,499 B2 | 4/2006 | Viola et al. |
| 7,061,415 B2 | 6/2006 | Magrath |
| 7,170,360 B2 | 1/2007 | Braun |
| 7,206,563 B1 | 4/2007 | Danielson et al. |
| 7,209,002 B2 | 4/2007 | Ohkuri et al. |
| 7,224,728 B2 | 5/2007 | Komamura |
| 7,245,767 B2 | 7/2007 | Moreno et al. |
| 7,453,653 B2 | 11/2008 | Dowski et al. |
| 7,639,896 B2 | 12/2009 | Sun et al. |
| 7,659,778 B2 | 2/2010 | Vainsencher |
| 7,684,651 B2 | 3/2010 | Tang et al. |

(Continued)

OTHER PUBLICATIONS

Banham, Mark R. et al., "Digital Image Restoration," IEEE Signal Processing Magazine, Mar. 1997, 24-41.

(Continued)

*Primary Examiner* — Jingge Wu

(74) *Attorney, Agent, or Firm* — Frommer Lawrence & Haug LLP; Bruce E. Black

(57) ABSTRACT

A method of processing an image includes determining at least one point spread function for the image. For each point spread function, the image, or at least a portion of the image, is filtered using at least one filter based on that point spread function to generate a corresponding filtered image for each filter. If only a single point spread function is determined then a plurality of different filters are used to individually filter the image, or at least a portion of the image, to generate a plurality of different filtered images. At least one quality metric is determined for each of the filtered images. A final filtered image is selected from the filtered images based on the at least one quality metric for each of the filtered images.

30 Claims, 3 Drawing Sheets

U.S. PATENT DOCUMENTS

| | | | |
|---|---|---|---|
| 7,742,239 B2 * | 6/2010 | Bell et al. | 359/737 |
| 7,852,350 B2 * | 12/2010 | Barone et al. | 345/611 |
| 2003/0063815 A1 * | 4/2003 | Watanabe | 382/255 |
| 2004/0252201 A1 | 12/2004 | Meitav et al. | |
| 2005/0047672 A1 | 3/2005 | Ben-Ezra et al. | |
| 2005/0058361 A1 * | 3/2005 | Tajima | 382/254 |
| 2005/0083517 A1 | 4/2005 | Asad et al. | |
| 2005/0110667 A1 | 5/2005 | Borisavljevic | |
| 2005/0246105 A1 | 11/2005 | Faber et al. | |
| 2005/0285670 A1 | 12/2005 | Ohkuri et al. | |
| 2006/0029291 A1 | 2/2006 | Sun et al. | |
| 2006/0034365 A1 | 2/2006 | Song et al. | |
| 2006/0072657 A1 | 4/2006 | Putzeys | |
| 2006/0098237 A1 | 5/2006 | Steinberg et al. | |
| 2006/0110147 A1 | 5/2006 | Tomita et al. | |
| 2006/0125938 A1 | 6/2006 | Ben-Ezra et al. | |
| 2007/0009169 A1 | 1/2007 | Bhattacharjya | |
| 2007/0014554 A1 | 1/2007 | Sasaki et al. | |
| 2007/0058073 A1 | 3/2007 | Steinberg et al. | |
| 2007/0065130 A1 | 3/2007 | Fukumoto et al. | |
| 2007/0104362 A1 | 5/2007 | Hwang et al. | |
| 2007/0122049 A1 * | 5/2007 | Dowski et al. | 382/254 |
| 2007/0201732 A1 | 8/2007 | Wahlsten | |
| 2007/0286514 A1 * | 12/2007 | Brown et al. | 382/254 |
| 2007/0286517 A1 * | 12/2007 | Paik et al. | 382/255 |
| 2008/0203276 A1 * | 8/2008 | Dowski et al. | 250/208.1 |
| 2008/0253623 A1 | 10/2008 | Hauke | |
| 2009/0060373 A1 * | 3/2009 | Perera et al. | 382/264 |
| 2009/0154823 A1 * | 6/2009 | Ben-Ezra et al. | 382/255 |
| 2011/0032392 A1 * | 2/2011 | Litvinov et al. | 348/241 |

OTHER PUBLICATIONS

Ben-Ezra, Moshe et al, "Motion-Based Motion Deblurring," IEEE Transactions on Pattern Analysis and Machine Intelligence, Jun. 2004, 26(6):689-698.

Ben-Ezra, Moshe et al., "Motion Deblurring Using Hybrid Imaging," (Department of Computer Science, Columbia University, New York, NY) IEEE 2003, 8 pages.

Farsiu, Sina et al., "Robust Shift and Add Approach to Super-Resolution," International Symposium on Optical Science and Technology, SPIE, Aug. 2003, San Diego, CA, 5203:121-130.

Gonzalez, R. C. et al., Digital Image Processing Second Edition (Addison-Wesley Publishing Company: Reading, MA) 1987, title page, publisher information page, pp. 334-338.

Lagendijk, Reginald L. et al., "Basic Methods for Image Restoration and Identification," Feb. 15, 1999, 25 pages.

Neyt, Xavier et al., "Directionally Adaptive Image Resolution," 1996, 5 pages.

Rabie, Tamer F. et al., "Adaptive-neighborhood Image Deblurring," Journal of Electronic Imaging, Oct. 1994, 3(4):368-378.

Raskar, Ramesh et al., "Coded Exposure Photography: Motion Deblurring Using Fluttered Shutter," ACM Transactions on Graphics (TOG), Jul. 2006, 25(3):795-804.

Pham, Tuan Q. et al., "Influence of Signal-to-Noise Ratio and Point Spread Function on Limits of Super-Resolution," Image Processing: Algorithms and Systems IV, 2005, SPIE-IS&T vol. 5672, pp. 169-180.

Primot, J. et al., "Deconvolution From Wave-front Sensing: A New Technique For Compensating Turbulence-degraded Images," The Journal of the Optical Society of America, A:Optics and Image Science, Sep. 1990, 7:1598-1608.

Pascual, C. et al., "High-Fidelity PWM Inverter for Audio Amplification Based on Real-Time DSP," University of Illinois, Jun. 19, 2002, pp. 1-32.

Hawksford, M. "Modulation and System Techniques in PWM and SDM Swtching Amplifiers," J. Audio Eng. Soc., vol. 54, No. 3, Mar. 3, 2006, pp. 107-139.

Hawksford, M. O. J., "Time-Quantized Frequency Modulation, Time-Domain Dither, Dispersive Codes and Parametrically Controlled Noise Shaping in SDM," J. Audio Eng. Soc., vol. 52, Jun. 6, 2004, pp. 587-617.

Trehan, C., "High Performance Class-D Amplifiers," Texas Tech University, May 2007, pp. 1-152.

Kiss, P. et al,, "Stable High-Order Delta-Sigma Digital-to-Analog Converters," IEEE Transactions on Circuits and Systems: Regular Papers, vol. 51, No. 1, Jan. 2004, pp. 200-205.

Lui, C. et al., "Kullback-Leibler Boosting," Computing Vision and Pattern Recognition, 2003, Proceedings 2003 IEEE Computer Society Conference, vol. 1, Jun. 18-20, 2003, pp. I-587-I-594.

Coetzee, "Correcting Kullback-Leibler Distance for Feature Selection," Journal Pattern Recognition Letters, vol. 26, No. 11, Aug. 2005.

Chung, A. C. S. et al., "Kulti-Modal Image Registration by Minimising Kullback-Leibler Distance," T. Dohi and R. Kikinis (Eds.): MICCAI 2002, LNCS 2489, 2002, pp. 525-532.

Gupta, A. et al., "Computational Models for Object Detection and Recognition," May 2004, 12 pages.

Papageorgiou, C. P. et al., "A General Framework for Object Detection," Sixth International Conference on Computer Vision, 1998, pp. 555-562.

Pilpre, A., "Self-* Properties of Multi Sensing Entities in Smart Environments," Thesis Submitted May 6, 2005 for the degree of Master of Science, Massachusetts Institute of Technology, Jun. 2005.

Viola, P. et al., "Robust Real-time Face Detection," International Journal of Computer Vision, 2005, 57(2):137-154.

Official Communication for U.S. Appl. No. 12/186,232 mailed Nov. 16, 2009.

Official Communication for U.S. Appl. No. 12/130,704 mailed Sep. 20, 2011.

Official Communication for U.S. Appl. No. 12/130,733 mailed Jul. 15, 2011.

* cited by examiner

METHOD, APPARATUS, AND SYSTEM FOR REDUCING BLURRING OF AN IMAGE USING MULTIPLE FILTERED IMAGES

CROSS REFERENCE TO RELATED APPLICATIONS

This application claims the benefit of U.S. Provisional Application No. 61/016,199 filed Dec. 21, 2007, herein incorporated by reference in its entirety.

FIELD

The present invention is directed to methods, apparatuses, and systems for processing images. The present invention is also directed to methods, apparatuses, and systems for processing images to reduce or eliminate blurring.

BACKGROUND

Digital cameras have become ubiquitous and can be used to take both still images and video images. The resolution of these cameras has increased dramatically. Moreover, digital cameras have been incorporated into a variety of devices with other functions such as, for example, mobile phones, personal data assistants (PDAs), and portable computers. A person using a camera, or other camera-containing device, will often take pictures while holding the device, rather than using a tripod or placing the camera on a stable surface. The motion of the camera while the shutter is open and the camera is capturing the image can result in a blurred image. There are other sources of blurring including, for example, imperfect lenses or other optical components and movement of the objects in the image. It is often desirable to reduce or eliminate noticeable blurring in the image.

A number of different methods have been developed to reduce blurring. For example, image capture exposure time may be reduced, at the expense of the signal-to-noise ratio (SNR) to reduce blurring. In another method, multiple images are captured sequentially and the image have the smallest perceived blur is selected. Such a selection can be made using an algorithm or based on the amount of motion detected by a motion sensor in the camera. In another method, an optical stabilization system, often used in conjunction with a motion sensor, moves the image photo sensor or the lens based on motion of the camera.

BRIEF DESCRIPTION OF THE DRAWINGS

Non-limiting and non-exhaustive embodiments of the present invention are described with reference to the following drawings. In the drawings, like reference numerals refer to like parts throughout the various figures unless otherwise specified.

For a better understanding of the present invention, reference will be made to the following Detailed Description, which is to be read in association with the accompanying drawings, wherein.

DETAILED DESCRIPTION

The present invention now will be described more fully hereinafter with reference to the accompanying drawings, which form a part hereof, and which show, by way of illustration, specific exemplary embodiments by which the invention may be practiced. This invention may, however, be embodied in many different forms and should not be construed as limited to the embodiments set forth herein; rather, these embodiments are provided so that this disclosure will be thorough and complete, and will fully convey the scope of the invention to those skilled in the art. Among other things, the present invention may be embodied as methods or devices. Accordingly, the present invention may take the form of an entirely hardware embodiment, an entirely software embodiment or an embodiment combining software and hardware aspects. The following detailed description is, therefore, not to be taken in a limiting sense.

Throughout the specification and claims, the following terms take the meanings explicitly associated herein, unless the context clearly dictates otherwise. The phrase "in one embodiment" as used herein does not necessarily refer to the same embodiment, though it may. Furthermore, the phrase "in another embodiment" as used herein does not necessarily refer to a different embodiment, although it may. Thus, as described below, various embodiments of the invention may be readily combined, without departing from the scope or spirit of the invention.

In addition, as used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise. In addition, throughout the specification, the meaning of "a," "an," and "the" include plural references. The meaning of "in" includes "in" and "on."

Briefly stated, the present invention is directed toward filtering an image to reduce blurring by processing the image using one or more point spread functions and one or more filters based on the point spread function(s) to generate multiple filtered images. At least one quality metric is then used to select one of the filtered images.

Reduction of Blurring in an Image

Figure 1:
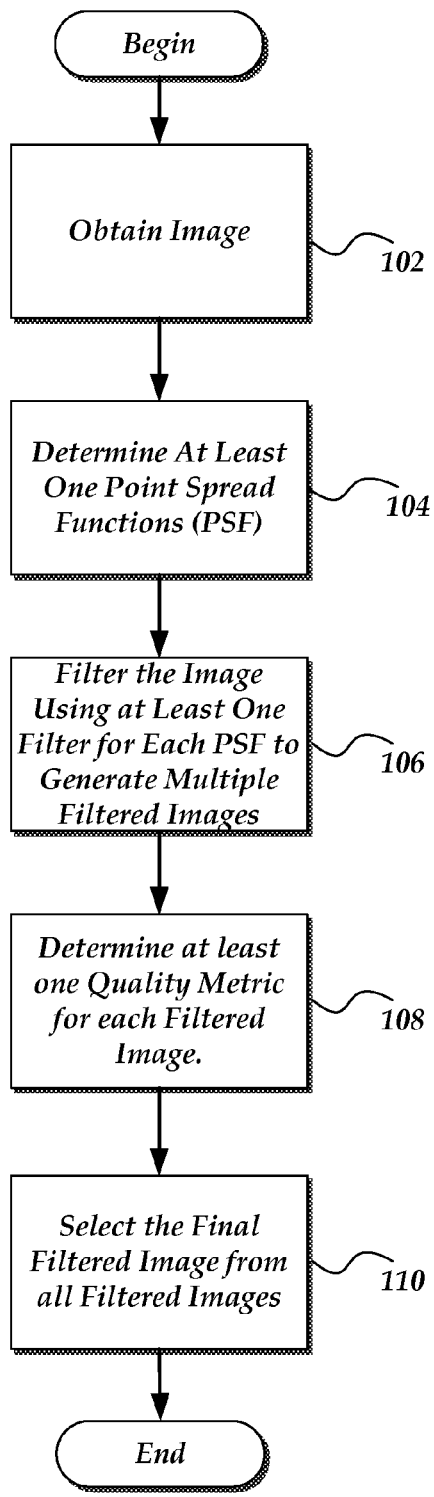
FIG. 1 is a flowchart illustrating one embodiment of a method of reducing blurring of an image, according to the invention.

FIG. 1 illustrates one embodiment of a method of reducing blurring of an image. First, the image is obtained (step 102), for example, from a camera or any other suitable image-taking device or from any other source of images, for example, a database of images. At least one point spread function (PSF) is then determined for the image, or a portion of the image (step 104). In at least some embodiments, more than one point spread function is determined.

The original image is individually filtered using at least one filter based on each PSF to generate multiple filtered images (step 106). In at least some embodiments, two or more different filters can be based on a PSF and can be used to individually filter the original image and generate multiple filtered images. If only a single PSF is determined in step 104, then multiple filters based on that PSF are individually used to filter the original image so that multiple filtered images are generated.

At least one quality metric is determined for each of the filtered images (step 108). A final image is selected from the multiple filtered images based, at least in part, on the at least one quality metric (step 110). The steps of the methods disclosed herein can be performed by the camera, or the image can be provided to another device (e.g., a computer) that processes the image and selects the final image, or the image can be partially processed by the camera and partially processed by another device.

In step 102, an image is obtained. In general, any camera can be used to capture the image. The image can be captured as a digital image or converted into a digital image. The camera can be still image camera or a video camera (or a combination thereof) and the image can be a still image or a video image. For video images, each frame can be processed individually using the methods disclosed herein or individual frames can be selectively processed. Moreover, video image frames may be processed using the methods described herein to generate a still image from one or more video image frames. Also, as indicated above, an image can be obtained from any other source including a database of images.

In at least some embodiments, the image is captured along with one or more capture parameters, such as information from a motion detector (e.g., one or more gyroscopes) in the camera. Optical parameters associated with the camera can also be capture parameters. For example, the optical zoom or effective focal length of the camera can be a capture parameter. For the same angular velocity of rotation, the blur extension is often proportional to the optical zoom.

In at least some embodiments, the influence of the PSF can have the form:

$$I_0[i,j] = H[i,j]*I[i,j] + n[i,j]$$

where $I_0[i,j]$ corresponds to the blurred image at pixel $[i,j]$; $I[i,j]$ is the unblurred image at pixel $[i,j]$; $H[i,j]$ is the PSF which is convolved with $I[i,j]$; and $n[i,j]$ is the noise. In at least some embodiments, the information from a motion sensor (e.g., one or more gyroscopes) in a camera or other capture parameters (including any combination of these parameters and information) can be used in choosing, determining, or calculating the PSF. Techniques such as blind deconvolution can also be used without capture parameters. (See, for example, D. Kundar and D. Hatzinakos, "Blind Image Deconvolution", IEEE Signal Processing Magazine 13 3(May), pp. 43-64 (1996), incorporated herein by reference.)

In step 104, one or more PSFs are determined for the image or one or more portions of the image. Any suitable PSF can be used and calculation techniques for PSFs are generally known.

In at least one embodiment, a PSF can be determined from information generated by gyroscopes that are sampled intermittently, for example, using an A/D converter. $Gyro_x[i]$ and $Gyro_y[i]$, $i=1, \ldots, N$, denote the gyro readings measuring the angular velocity along the x- and y-axes, respectively, where N is the number of samples during the exposure time. The gyro readings can be converted into the translational velocity of an image point in the sensor plane:

$$v_x[i] = \frac{Gyro_y[i] - Offset_y}{S} \cdot f$$

$$v_y[i] = \frac{Gyro_x[i] - Offset_x}{S} \cdot f$$

where $v_x[i]$ and $v_y[i]$ are the x- and y-components of the velocity of an image point, S is a parameter proportional to the sensitivity of the gyros, f is the optical zoom of the camera (i.e., the effective focal length), and $Offset_x$ and $Offset_y$ are the bias offsets of the x- and y-gyros (i.e. the values measured when the gyros are not rotating about their sensitive axes.) Values for S, $Offset_x$, and $Offset_y$ can be determined or can be estimated.

With the sampling interval represented by dt, if an image point with intensity I spends time dt at pixel [n,m], it contributes I*dt to the pixel value. In at least one embodiment, given the gyroscope information, a PSF, H[n,m], can be calculated as follows (using pseudocode):

Initialization:
H[n,m]=0 for all n,m;
x=0;
y=0;
for (i=1; i<=N; i++) {
x=x+v_x[i]·dt;
y=y+v_y[i]·dt;
m=round(x);
m=round(y);
H[n,m]=H[n,m]+dt;
}

If a third gyro measuring the angular velocity along the z-axis (which is perpendicular to the sensor plane) is used, the PSF may be space dependent.

In at least some embodiments, coefficients of the PSF may be zeroed to reduce the size of the PSF. Different PSFs can be generated by variation in the number of, or selection of, coefficients that are zeroed. Furthermore, if the z-transform $H(z_1,z_2)$ of the PSF can be factored (exactly or approximately) to a product of several lower-order polynomials, different PSFs can be generated by removing one or more factors from $H(z_1, z_2)$. In particular, if H[n,m] is the PSF, then its z-transform is given by $$H(z_1, z_2) = \sum_n \sum_m H[n, m] z_1^{-n} z_2^{-m}$$

In at least some embodiments, $H(z_1,z_2)$ can often be represented as a product of K factors:

$$H(z_1, z_2) = \prod_{k=1}^{K} P_k(z_1, z_2),$$

where $P_k(z_1, z_2)$ are two-dimensional polynomials of order lower than that of $H(z_1,z_2)$. Different PSFs $H_i(z_1,z_2)$ can be calculated as follows:

$$H_i(z_1, z_2) = \prod_{u_i(k)=1} P_k(z_1, z_2)$$

where $u_i(k)$ can be 0 or 1 for each k.

Once one or more PSFs are determined, each PSF is used individually to generate at least one corresponding filtered image. As an example of reducing blurring, at least one adaptive deblurring filter, based on a PSF, can be applied to the image (or to one or more portions of the image). In at least some embodiments, the selection of a filter may also be based on the signal-to-noise ratio of the image. The same filter can be used with each PSF or individual filters can be selected for each PSF so that not all of the PSFs use the same filter. Optionally, different filters based on the same PSF may be selected for individually filtering the entire image or for filtering different portions of the image. If only a single PSF is determined in step 104, then multiple filters based on that PSF are individually used to filter the original image so that multiple filtered images are generated.

Examples of suitable filters include the Wiener filter, the Lucy-Richardson filter, the inverse filter, the pseudoinverse filter, the regularized filter, and the like. As an example, the 2D Fourier transform of the Wiener filter, $H_w(u,v)$ can be written as:

$$H_w(u, v) = \frac{H^*(u, v) \cdot P_I(u, v)}{|H(u, v)|^2 \cdot P_I(u, v) + P_n(u, v)}$$

where $P_I(u,v)$ and $P_n(u,v)$ are the power spectral densities of the unblurred image and the noise, respectively, $H(u,v)$ is the 2D Fourier transform of the PSF, and $H^*(u,v)$ is the complex conjugate of $H(u,v)$. It will be recognized that more than one filter can be generated from any given PSF. The different filters can be applied to different portions of the image (e.g., a different filter might be used for faces) or multiple filters can be applied to the entire image or the same portions of the image. In these latter embodiments, there may be more than one filtered image generated.

After the multiple filtered images are generated, at least one quality metric is determined for each of the filtered images. Any suitable quality metric can be used. The quality metric(s) can be related to one or more criteria such as, for example, the amount of residual blurring in the filtered images or portions of the filtered images, the level of artifacts (e.g., ghosts) generated by the deblurring process, and the like.

The quality metric(s) may be determined for the entire image, for one or more portions of the image, or for a reduced resolution image or one or more portions of a reduced resolution image. A "reduced resolution" image is an image based on the original image, or on one of the filtered images, in which the number of pixels have been reduced. The formation of reduced resolution images is well known and any suitable technique can be used. For example, pixels in the original image, or one of the filtered images, may be deleted to form the reduced resolution image (e.g., every other pixel or every third, fourth, etc pixel is deleted or retained) or a pixel in the reduced resolution image may be generated as a combination of pixel values for a pixel neighborhood in the original or filtered image. The use of reduced resolution images for determining the quality metric(s) can be beneficial to reduce calculation complexity and calculation time. Alternatively or additionally, the quality metric may only be determined for one or more portions of the image (e.g., one half, one third, one fourth, one fifth, one eighth, or one tenth of the image or some other selected portion) to reduce calculation complexity and calculation time. In some embodiments, a region of the image may be selected based on derivatives calculated from pixel values along one or more directions in the image. For example, a region with relatively high derivatives in one or more directions based on pixel values may be selected.

As one example, a metric can be based on measuring autocorrelation values for each of the original and filtered images and comparing the autocorrelation values between the original image and the filtered image. The autocorrelation values can be a particularly useful as an indicator of artifacts (e.g., ghosts) in the filtered images. The level of artifact generation can then be considered in combination with the level of reduction in blurring to select a final image from the filtered images. In at least some instances, there may be a trade-off between artifact creation and reduction in blurring.

Autocorrelation values can be determined in one or more directions for the image. As one example, autocorrelation values can be determined in the x, y, x=y (denoted "x/y"), and x=−y (denoted "x/−y") directions. In another embodiment, only the x and y directions are considered. It will be understood that other selections of directions can also be used.

Figure 2:
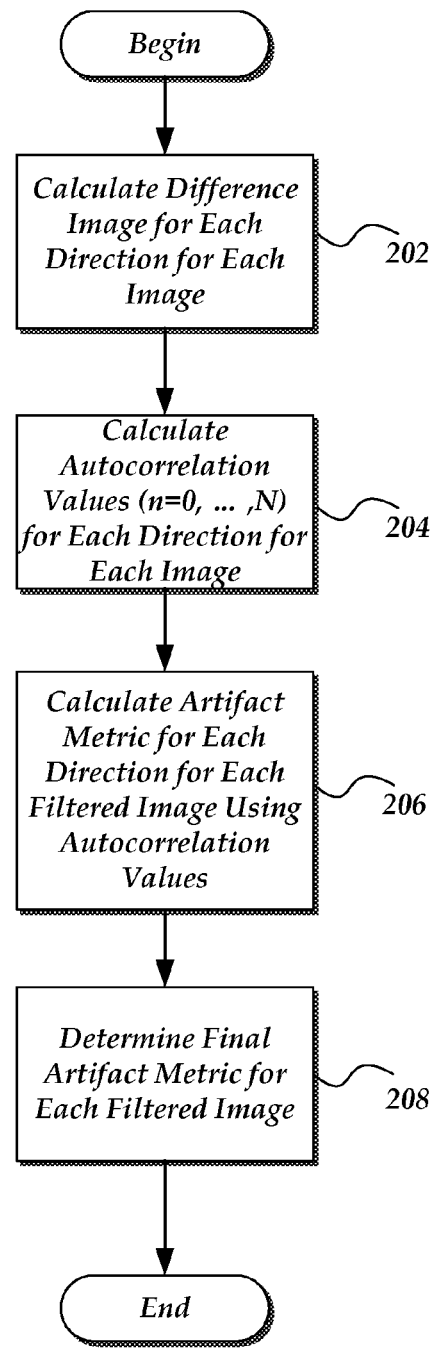
FIG. 2 is a is a flowchart illustrating one embodiment of a method of determining a quality metric for each filtered image, according to the invention.

The following is one embodiment of a method for calculation of the autocorrelation values, as illustrated in FIG. 2. It will be understood that a variety of other methods can be used. In this embodiment, autocorrelation values are determined for the x, y, x/y, and x/−y directions. For the original image and for each of the filtered images, a difference image is individually calculated for each direction (step 202). In at least some embodiments, negative values are set to zero. For example, the difference image for the x-direction can be calculated as:

$D_x[y,x] = I[y,x] - I[y,x-1]$, if $I[y,x] - I[y,x-1] > 0$ $D_x[y,x] = 0$, otherwise where $I[y,x]$ is a measure of the intensity (e.g., the luma component) of the pixel at site $[y, x]$. Individual difference images are calculated for the original image and each of the filtered images. The difference images for the other directions can be calculated in a similar manner using the following equations:

y-direction:

$D_y[y,x] = I[y,x] - I[y-1,x]$, if $I[y,x]I[y-1,x] > 0$ $D_y[y,x] = 0$, otherwise x/y-direction $D_{x/y}[y,x] = I[y,x] - I[y-1,x-1]$, if $I[y,x] - I[y-1,x-1] > 0$ $D_{x/y}[y,x] = 0$, otherwise x/−y-direction $D_{x/-y}[y,x] = I[y,x] - I[y+1,x-1]$, if $I[y,x] - I[y+1,x-1] > 0$ $D_{x,-y}[y,x] = 0$, otherwise For each direction, the normalized autocorrelation of the corresponding difference image D is calculated (step 204). For example, for the x-direction, an autocorrelation value $r_x[n]$ can be calculated as:

$$r_x[n] = \frac{\sum D_x[y, x] D_x[y, x+n]}{\sum D_x[y, x]^2}$$

where the summation terms are performed over all y and x values. Alternatively, if only a portion of the image is to be considered in the determination of the quality metric than the summation is over a subset of y and x values corresponding to that portion. The autocorrelation value is determined for each $n=0, \ldots, N$. N can be selected to be any number. In one embodiment N is at least the PSF support value or at least twice the PSF support value. The PSF support value can be the size of a PSF. For example, the PSF support value of PSF $h[n,m]$ can be defined as follows. Let S be the set of all $(n,m)$ values for which $h[n,m]$ is different from 0. Denote:

$$m_1 = \min_S m$$

$$m_2 = \max_S m$$

$$n_1 = \min_S n$$

$$n_2 = \max_S n$$

The PSF support value in the x-direction is $m_2-m_1+1$, and the PSF support value in the y-direction is $n_2-n_1+1$.

It will be understood that other values of N can be selected. The values $r_i[n]$ (where i=x, y, x/y, x/−y) are calculated for each direction for the original image and for each of the filtered images.

A quality metric, such as the artifact (or "ghost") metric G can be calculated using the autocorrelation values, $r_i[n]$ (step 206). One example of a suitable metric $G_x^a$ (illustrated for the x-direction) is:

$$G_x^a = \sum_{n=0}^{N} \max(r_x^a[n] - r_x^0[n] - \alpha, 0)$$

where $r_x^a[n]$ is the x-direction autocorrelation value for one of the filtered images designated a, $r_x^0[n]$ is the x-direction autocorrelation value for the original image, and α is an optional constant. The constant α can be any suitable value and may be determined empirically. In one embodiment, α is 0.03. Similar metrics can be generated for each of the other directions; y, x/y, and x/−y. The artifact metric G in each direction is calculated for each filtered image (a=1, ..., M, where M is the number of filtered images.)

The final artifact metric for each filtered image can be selected from the artifacts metrics in each direction (step 208). In one embodiment, the final metric, $G^a$, for each filtered image is the maximum value of the artifact metric for that image between the four directions:

$$G^a = \max\{G_x^a, G_y^a, G_{x/y}^a, G_{x/-y}^a\}$$

Accordingly, a value of G can be determined for each of the filtered images. In other embodiments, the final artifact metric may be an average, mean, or some other combination of the directional artifact metrics of that image.

As another embodiment of a metric G based on the autocorrelation function, only pronounced local maxima of $r_x^a[n] - r_x^0[n]$ as a function of n contribute to the metric. The threshold for identifying a local maximum can be selected manually or algorithmically. The contribution of each maximum to the metric G can be proportional to the height of the maximum.

In yet other embodiments, other metrics of image quality, not necessarily related to ghost artifacts, can be used. For example, the gradient magnitudes of natural images often obey heavy-tailed distributions (see, for instance, R. Fergus et al, "Removing camera shake from a single photograph", *ACM Transactions on Graphics,* Volume 25, 3 (July), pp. 787-794, 2006, incorporated herein by reference) and can be used as a metric.

The collection of the artifact metrics G for each of the filtered images can then be used to select one of the filtered images as the final image. In at least some embodiments, the artifact metric G may be combined with one or more other metrics to select the final image.

One such metric is the degree of partialness of the PSF: sharpness metric S. In one embodiment, the sharpness metric S is defined as the sum of the PSF coefficients left unzeroed. In another embodiment, a sharpness metric can be selected as a measure of the degree of residual blur that remains if an image blurred with the actual PSF $h_1$ is restored using a partial PSF $h_2$. For example, this metric could be determined by taking an image of a point (the delta function), blur it with the actual PSF $h_1$, restore the result using a partial PSF $h_2$, and then examine how different the restored image is from the original point (the delta function). The greater the deviation of the restored image from the delta function, the smaller the sharpness metric S.

Another metric is the degree of initial blur, B. In one embodiment, the degree of initial blur is defined as the reciprocal of the maximum coefficient of the full PSF (e.g., a PSF with no unzeroed coefficients.)

In another embodiment, the degree of initial blur can be determined based the effective size of the PSF which often correlates to the blur extension of the image. The effective size of the PSF can be calculated, for example, using the moments K of the PSF around one or more directions. For example, the moments K of the PSF in each one of the four directions (x, y, x/y, and x/−y) can be calculated using the following equations:

$$K_x = \sum_{x,y} |x| \cdot H[x, y]$$

$$K_y = \sum_{x,y} |y| \cdot H[x, y]$$

$$K_{diag1} = \sum_{x,y} \frac{|x+y|}{2} \cdot H[x, y]$$

$$K_{diag2} = \sum_{x,y} \frac{|x-y|}{2} \cdot H[x, y]$$

where H[x,y] is the PSF. In at least some embodiments, the effective size of the PSF corresponds to at least one of the moments. In at least some embodiments, the effective size of the PSF in each direction corresponds to the moment in that direction.

In at least some embodiments, there is a tradeoff between the amount of ghosts (e.g., artifacts), represented by the artifact metric G, and the sharpness of the filtered image, represented by the metric S. The degree of initial blur can be used to determine a trade-off factor T. In at least some embodiments, the greater the degree of initial blur, the larger the value of T.

Figure 3:
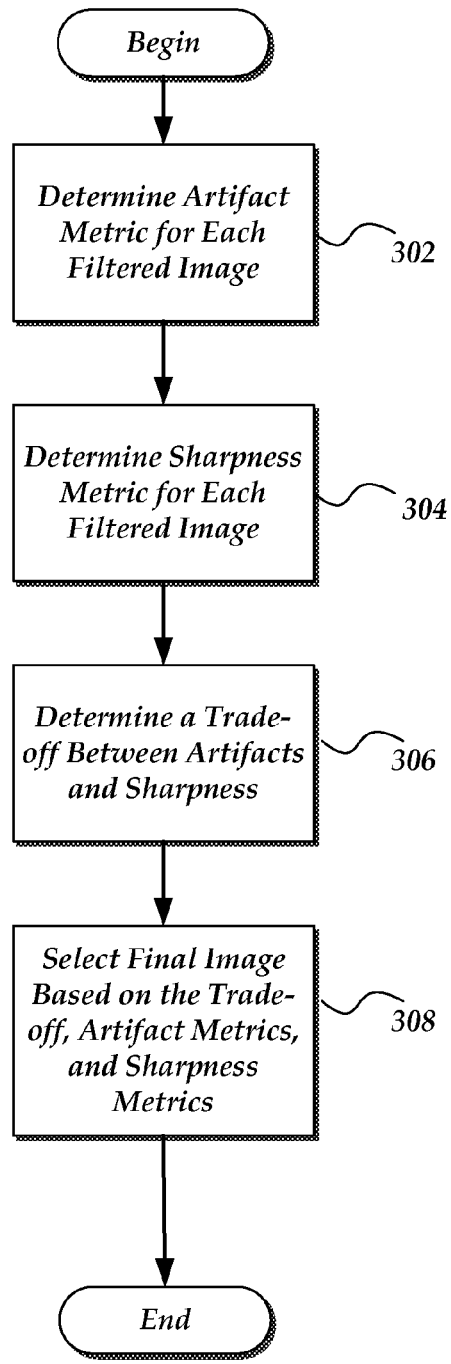
FIG. 3 is a is a flowchart illustrating one embodiment of a method of selecting an image from multiple filtered images using two quality metrics, according to the invention.

FIG. 3 illustrates one embodiment of determining a final image. An artifact metric is determined for each filtered image (step 302). A sharpness metric is determined for each filtered image (step 304). A trade-off value is determined as the acceptable trade-off between the level of artifacts and the level of sharpness (step 306). This trade-off value may be determined manually or algorithmically or any combination thereof (e.g., a manual setting that is included within an algorithm to determine the trade-off value.) The final image is selected from the filtered images based on the trade-off value, artifact metric for each filtered image, and sharpness metric for each filtered image (step 308).

In one embodiment, the following pseudo-code (or any other arrangement that performs the same or similar calculation) is used to select the final filtered image. All of the filtered images are arranged in descending order of metric S. The coefficient i identifies the images in this order and runs from 1 to M where M is the number of filtered images (which may also represent the number of individual PSFs.)
best_ind=1;
Ghosts_Th=max{G(1)/3, 0.01};

```
for (i=2; i<=number of PSFs; i++){
    if (G(best_ind)<Ghosts_Th){
    break;
    }
    Ghosts_ratio=log[G(best_ind)/G(i)];
    Sharpness_diff=S(best_ind)–S(i);
    if Ghosts_ratio>T*Sharpness_deff){
    best_ind=I;
    }
}
```

It will be understood that each block of the flowchart illustrations, and combinations of blocks in the flowchart illustrations, can be implemented by computer program instructions. These program instructions may be provided to a processor to produce a machine, such that the instructions, which execute on the processor, create means for implementing the actions specified in the flowchart block or blocks. The computer program instructions may be executed by a processor to cause a series of operational steps to be performed by the processor to produce a computer implemented process such that the instructions, which execute on the processor to provide steps for implementing the actions specified in the flowchart block or blocks. The computer program instructions may also cause at least some of the operational steps shown in the blocks of the flowchart to be performed in parallel. Moreover, some of the steps may also be performed across more than one processor, such as might arise in a multi-processor computer system. In addition, one or more blocks or combinations of blocks in the flowchart illustration may also be performed concurrently with other blocks or combinations of blocks, or even in a different sequence than illustrated without departing from the scope or spirit of the invention.

Accordingly, blocks of the flowchart illustrations support combinations of means for performing the specified actions, combinations of steps for performing the specified actions and program instruction means for performing the specified actions. It will also be understood that each block of the flowchart illustration, and combinations of blocks in the flowchart illustration, can be implemented by special purpose hardware-based systems which perform the specified actions or steps, or combinations of special purpose hardware and computer instructions.

The computer program instructions, or portions of the computer program instructions, can be stored on any suitable computer-readable medium including, but not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computing device.

Illustrative Camera Device

Figure 4:
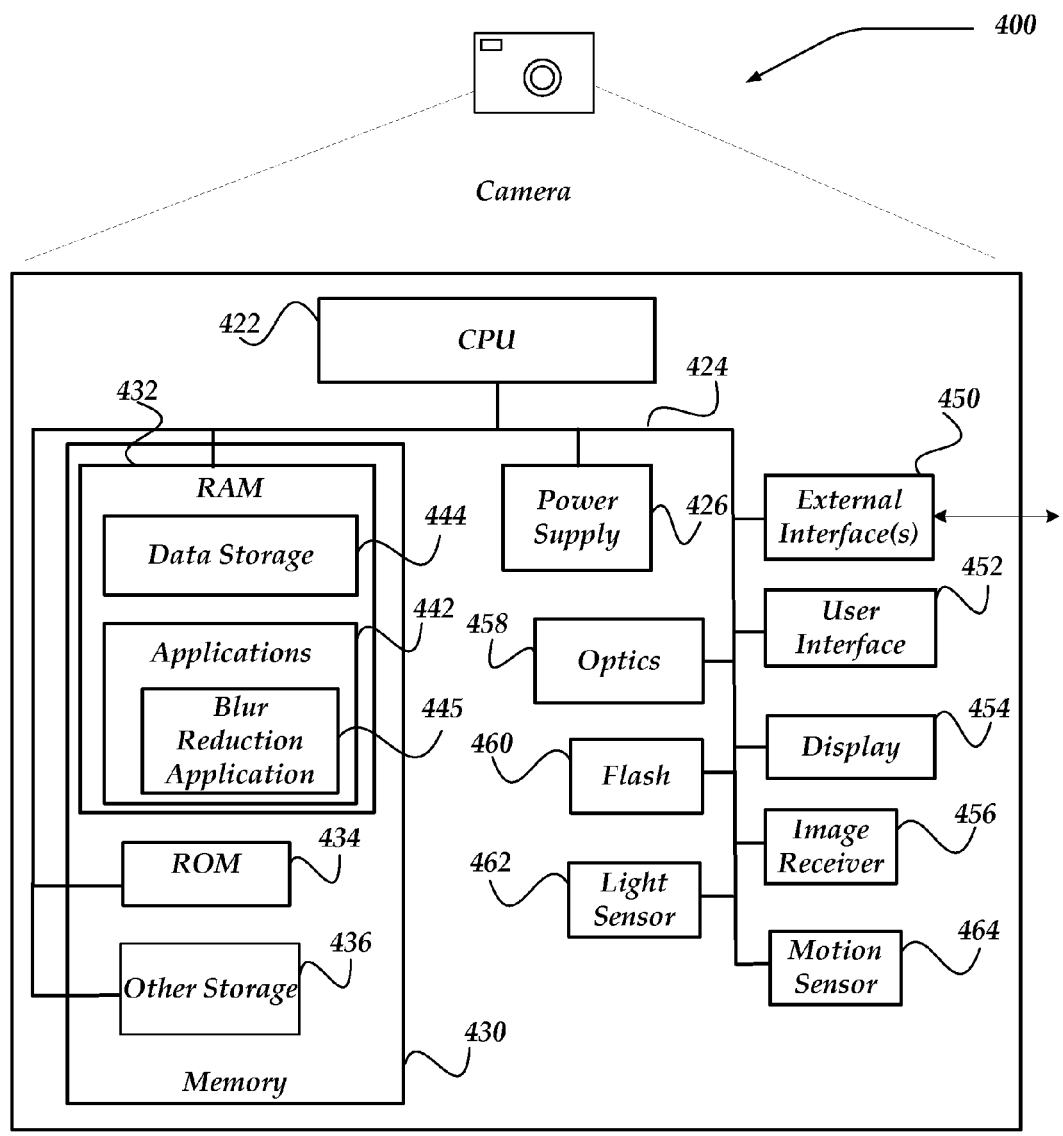
FIG. 4 is a schematic diagram of components of a camera useful for the methods of the invention.

FIG. 4 shows one embodiment of a camera 400 that may be used in implementing the invention. Camera 400 may include more or fewer components than those shown in FIG. 4. However, the components shown are sufficient to disclose an illustrative embodiment for practicing the present invention. It will be understood, however, that the methods described above may be performed by camera 400 or may be performed, entirely or partially, by another device that receive an image captured by camera 400. Moreover, such a device may be used to process images that have been captured by a camera (or other image-capture device) substantially different from the camera illustrated in FIG. 4 including analog cameras that capture images on film. The images can be converted into digital representations by scanning or any other suitable method and can then be processed as described above to reduce blurring of the image. It will also be recognized that the methods described above may also be applied to images that are generated by techniques other than image capture using a camera including computer-generated images.

The camera 400 may be a camera for taking still pictures or motion pictures (e.g., a video camera). The camera 400 may be a stand-alone camera or may be part of a device such as, for example, a mobile phone, PDA, computer, and the like.

As shown in the figure, the camera 400 includes a processing unit (CPU) 422 in communication with a memory 430 via a bus 424. Camera 400 also includes a power supply 426, one or more external interfaces 450, a user interface 452, a display 454, an image receiver 456, optics (e.g., lens(es) and shutter) 458, a flash 460, a light sensor 462, and a motion sensor 464. Power supply 426 provides power to camera 400. A rechargeable or non-rechargeable battery may be used to provide power. The power may also be provided by an external power source, such as an AC adapter.

The optics 458 includes the lens(es), shutter, focusing apparatus, and other optical components that allow the camera to generate an image on the image receiver 456. Any suitable optical arrangement can be used. The image receiver 456 can be any suitable device for receiving the image and generating an electrical representation of the image including, but not limited to, an array of charge-coupled devices (CCD array) or array of CMOS detectors. Preferably, the image receiver generates a digital representation of the image, although it will be understood that analog image receivers can be used and the analog image representation can then be digitized or scanned to generate a digital representation.

The camera 400 may also include a flash 460 to provide additional light when automatically or manually activated. The camera 400 may also include a light sensor 462 to measure the amount of ambient light. The camera 400 may also include a motion sensor 464, such as one or more gyroscopes. The motion sensor 464 may be useful for stabilizing the camera as a picture or video is being taken. The motion sensor may also be useful for later processing, including reducing blurring, of the image as described, for example, above.

The camera 400 typically includes a user interface 452 that allows the user to operate the camera and to change various settings of the camera. The user interface 452 may also allow the user to view images (still or video) on the display 454 of the camera, set parameters related to the capture or processing or images, or send or receive images from the camera.

Camera 400 may optionally communicate with another device, such as a computer or mobile telephone, or with a wired or wireless network. External interface 450 can include a port for coupling the camera 400 to another device or may include circuitry for coupling camera 400 to one or more networks. This circuitry, if provided, may be constructed for use with one or more wired or wireless communication protocols.

Display 454 may be a liquid crystal display (LCD), light emitting diode (LED), or any other type of display. Display 454 may also include a touch sensitive screen arranged to receive input from an object such as a stylus or a digit from a human hand.

Memory 430 typically includes a RAM 432 and a ROM 434 and may include other storage devices. Memory 430 may store processor readable instructions, data structures, program modules or other data. Memory 430 further includes one or more permanent data storage 444, which can be utilized by camera 400 to store, among other things, applications 442, images (still or video), and/or other data. It will be understood that a portion of the memory 436 may be removable from the camera. For example, removable storage memory includes diskettes, memory sticks, memory cards, and the like.

Applications 442 may include computer executable instructions which, when executed by camera 400, control operation of the camera, process images, store images, or transmit or receive images. Applications 442 may further include a blur reduction application 445 as discussed above. In other embodiments, as discussed above, the blur reduction application may be resident on another device.

It will be understood that if the camera is part of another device, such as a mobile phone, PDA, or computer, components of the camera may be shared with other portions of the device. Shared components can include, but are not limited to, for example, the CPU, memory (including RAM, ROM, data storage, other storage, and applications), power supply, external interface(s), user interface, and display.

It will also be recognized that any portion of the methods described herein, including all portions relating to processing of an image, can be performed by a device other than a camera or a camera-containing device. For example, the processing of an image can be performed entirely, or partially, by a separate device such as a computer or the like.

The above specification, examples and data provide a description of the manufacture and use of the composition of the invention. Since many embodiments of the invention can be made without departing from the spirit and scope of the invention, the invention also resides in the claims hereinafter appended.

What is claimed as new and desired to be protected by Letters Patent of the United States is:

1. A method of processing an image, the method comprising:
    determining at least one point spread function for the image;
    for each point spread function, filtering the image, or at least a portion of the image, using at least one filter based on that point spread function to generate a corresponding filtered image for each filter, wherein if only a single point spread function is determined then a plurality of different filters are used to individually filter the image, or at least a portion of the image, to generate a plurality of different filtered images;
    determining at least one quality metric for each of the filtered images, wherein the at least one quality metric comprises a first quality metric selected from i) a quality metric associated with a level of artifacts generated in the filtered image by the filtering of the image, ii) a quality metric associated with an amount of residual blurring in the filtered image, or iii) a quality metric associated with a level of sharpness of the filtered image; and
    selecting a final filtered image from the filtered images based on the at least one quality metric for each of the filtered images.

2. The method of claim 1, further comprising obtaining the image using a camera.

3. The method of claim 2, further comprising obtaining motion information about motion of the camera while the image is obtained.

4. The method of claim 3, wherein calculating the point spread function comprises calculating the point spread function using the motion information.

5. The method of claim 1, wherein determining at least one point spread function comprises determining a plurality of point spread functions.

6. The method of claim 1, wherein the first quality metric is a quality metric associated with a level of artifacts generated in the filtered image by the filtering of the image.

7. The method of claim 1, wherein determining at least one quality metric for each of the filtered images comprises determining the first quality metric and a second quality metric for each of the filtered images.

8. The method of claim 7, wherein the first quality metric is a quality metric associated with a level of artifacts generated in the filtered image by the filtering of the image and the second metric is a quality metric associated with a level of sharpness of the filtered image.

9. The method of claim 8, wherein selecting a final filtered image comprises selecting the final filtered image by based on a trade-off between the level of artifacts and the level of sharpness for each of the filtered images.

10. The method of claim 1, wherein determining at least one quality metric for each of the filtered images comprises determining a plurality of autocorrelation values in at least one direction for each of the filtered images.

11. The method of claim 10, wherein determining the plurality of autocorrelation values comprises determining the plurality of autocorrelation values in at least the x, y, x=y, and x=−y directions for each of the filtered images.

12. The method of claim 11, wherein determining at least one quality metric comprises determining a level of artifacts generated in the filtered image by the filtering of the image using the autocorrelation values in at least the x, y, x=y, and x=−y directions for each of the filtered images.

13. The method of claim 10, wherein determining the plurality of autocorrelation values comprises determining the plurality of autocorrelation values using a difference image.

14. The method of claim 10, wherein determining at least one quality metric comprises comparing, for each of the filtered images, the autocorrelation values in at least one direction with autocorrelation values determined for the image.

15. A device that is operative to process an image, comprising:
    a processor for executing processor-readable instructions that enable actions, including:
        determining at least one point spread function for the image;
        for each point spread function, filtering the image, or at least a portion of the image, using at least one filter based on that point spread function to generate a corresponding filtered image for each filter, wherein if only a single point spread function is determined then a plurality of different filters are used to individually filter the image, or at least a portion of the image, to generate a plurality of different filtered images;
        determining at least one quality metric for each of the filtered images, wherein the at least one quality metric comprises a first quality metric selected from i) a quality metric associated with a level of artifacts generated in the filtered image by the filtering of the image, ii) a quality metric associated with an amount of residual blurring in the filtered image, or iii) a quality metric associated with a level of sharpness of the filtered image; and
        selecting a final filtered image from the filtered images based on the at least one quality metric for each of the filtered images.

16. The device of claim 15, wherein the device is a camera.

17. The device of claim 15, wherein the device is a mobile telephone or personal data assistant.

18. The device of claim 15, wherein the device is a computer.

19. The device of claim 15, wherein the first quality metric is a quality metric associated with a level of artifacts generated in the filtered image by the filtering of the image.

20. The device of claim 15, wherein determining at least one quality metric for each of the filtered images comprises determining the first quality metric and a second quality metric for each of the filtered images.

21. The device of claim 20, wherein the first quality metric is a quality metric associated with a level of artifacts generated in the filtered image by the filtering of the image and the second metric is a quality metric associated with a level of sharpness of the filtered image.

22. The device of claim 15, wherein determining at least one quality metric for each of the filtered images comprises determining a plurality of autocorrelation values in at least one direction for each of the filtered images.

23. A computer-readable medium having processor-executable instructions for processing an image, the processor-executable instructions when installed onto a device enable the device to perform actions, comprising:
    determining at least one point spread function for the image;
    for each point spread function, filtering the image, or at least a portion of the image, using at least one filter based on that point spread function to generate a corresponding filtered image for each filter, wherein if only a single point spread function is determined then a plurality of different filters are used to individually filter the image, or at least a portion of the image, to generate a plurality of different filtered images;
    determining at least one quality metric for each of the filtered images, wherein the at least one quality metric comprises a first quality metric selected from i) a quality metric associated with a level of artifacts generated in the filtered image by the filtering of the image, ii) a quality metric associated with an amount of residual blurring in the filtered image, or iii) a quality metric associated with a level of sharpness of the filtered image; and
    selecting a final filtered image from the filtered images based on the at least one quality metric for each of the filtered images.

24. The computer-readable medium of claim 23, wherein the first quality metric is a quality metric associated with a level of artifacts generated in the filtered image by the filtering of the image.

25. The computer-readable medium of claim 23, wherein determining at least one quality metric for each of the filtered images comprises determining the first quality metric and a second quality metric for each of the filtered images.

26. The computer-readable medium of claim 23, wherein the first quality metric is a quality metric associated with a level of artifacts generated in the filtered image by the filtering of the image and the second metric is a quality metric associated with a level of sharpness of the filtered image.

27. The computer-readable medium of claim 23, wherein determining at least one quality metric for each of the filtered images comprises determining a plurality of autocorrelation values in at least one direction for each of the filtered images.

28. The computer-readable medium of claim 27, wherein determining the plurality of autocorrelation values comprises determining the plurality of autocorrelation values in at least the x, y, x=y, and x=−y directions for each of the filtered images.

29. The computer-readable medium of claim 28, wherein determining at least one quality metric comprises determining a level of artifacts generated in the filtered image by the filtering of the image using the autocorrelation values in at least the x, y, x=y, and x=−y directions for each of the filtered images.

30. The computer-readable medium of claim 27, wherein determining at least one quality metric comprises comparing, for each of the filtered images, the autocorrelation values in at least one direction with autocorrelation values determined for the image.

\* \* \* \* \*

UNITED STATES PATENT AND TRADEMARK OFFICE
CERTIFICATE OF CORRECTION

PATENT NO.         : 8,090,212 B1                Page 1 of 1
APPLICATION NO.    : 12/130993
DATED              : January 3, 2012
INVENTOR(S)        : Artemy Baxansky et al.

It is certified that error appears in the above-identified patent and that said Letters Patent is hereby corrected as shown below:

On Page 2, in column 2, line 13, under "Other Publications", delete "Swtching" and insert -- Switching --, therefor.

On Page 2, in column 2, line 24, under "Other Publications", delete "Computing" and insert -- Computer --, therefor.

In column 3, line 50, delete "AID" and insert -- A/D --, therefor.

In column 6, line 28, delete "]I[" and insert -- ]-I[ --, therefor.

In column 6, line 40, delete "$D_{x,-y}$" and insert -- $D_{x/-y}$ --, therefor.

In column 9, line 5, delete "Ghosts" and insert -- (Ghosts --, therefor.

In column 9, line 7, delete "deff)" and insert -- diff) --, therefor.

In column 12, line 15, in Claim 9, after "filtered image" delete "by".

Signed and Sealed this
Twenty-eighth Day of February, 2012

David J. Kappos
*Director of the United States Patent and Trademark Office*